(12) United States Patent
Liu et al.

(10) Patent No.: US 7,743,818 B2
(45) Date of Patent: Jun. 29, 2010

(54) HEAT EXCHANGE MODULE

(75) Inventors: Tay-Jian Liu, Guangdong (CN);
Chih-Feng Fan, Guangdong (CN);
Chih-Peng Lee, Guangdong (CN);
Chao-Nien Tung, Guangdong (CN)

(73) Assignee: Foxconn Technology Co., Ltd.,
Tu-Cheng City, Taipei Hsien, Taiwan
(CN)

( * ) Notice: Subject to any disclaimer, the term of this patent is extended or adjusted under 35 U.S.C. 154(b) by 844 days.

(21) Appl. No.: 11/308,070

(22) Filed: Mar. 5, 2006

(65) Prior Publication Data
US 2007/0012427 A1    Jan. 18, 2007

(30) Foreign Application Priority Data
Jul. 15, 2005    (CN) .................... 2005 1 0036037

(51) Int. Cl.
*F28D 15/00* (2006.01)
(52) U.S. Cl. ............... 165/104.26; 165/104.21; 165/104.33
(58) Field of Classification Search ............ 165/104.14, 165/104.21, 104.26, 104.33, 185, 122; 361/700, 361/707, 709
See application file for complete search history.

(56) References Cited

U.S. PATENT DOCUMENTS

| 4,226,282 | A | * | 10/1980 | Kunsagi et al. | ........ | 165/104.14 |
| 5,729,995 | A | * | 3/1998 | Tajima | ................ | 165/104.21 |
| 5,842,514 | A | * | 12/1998 | Zapach et al. | ......... | 165/104.33 |
| 7,156,158 | B2 | * | 1/2007 | Ueda et al. | ............. | 165/104.21 |

FOREIGN PATENT DOCUMENTS

| CN | 1393678 A | 1/2003 |
| CN | 2627649 Y | 7/2004 |

* cited by examiner

*Primary Examiner*—Ljiljana (Lil) V Ciric
(74) *Attorney, Agent, or Firm*—Winston Hsu

(57) ABSTRACT

A heat exchange module (1) includes a fan duct, an evaporator (22), a condenser (26) and an electric fan (50). The fan duct includes a lower portion (10) and an upper portion (30). The lower portion cooperates with the upper portion to define therebetween an air passage (90). The evaporator contains therein a working fluid. The condenser is in fluid communication with the evaporator. The evaporator and the condenser are received in the air passage defined by the fan duct. The working fluid turns into vapor in the evaporator upon receiving heat from a heat-generating component (70) and the vapor turns into condensate upon releasing the heat to the condenser. The electric fan is attached to the fan duct. The electric fan produces an airflow flowing through the air passage for removing the heat away from the condenser.

19 Claims, 10 Drawing Sheets

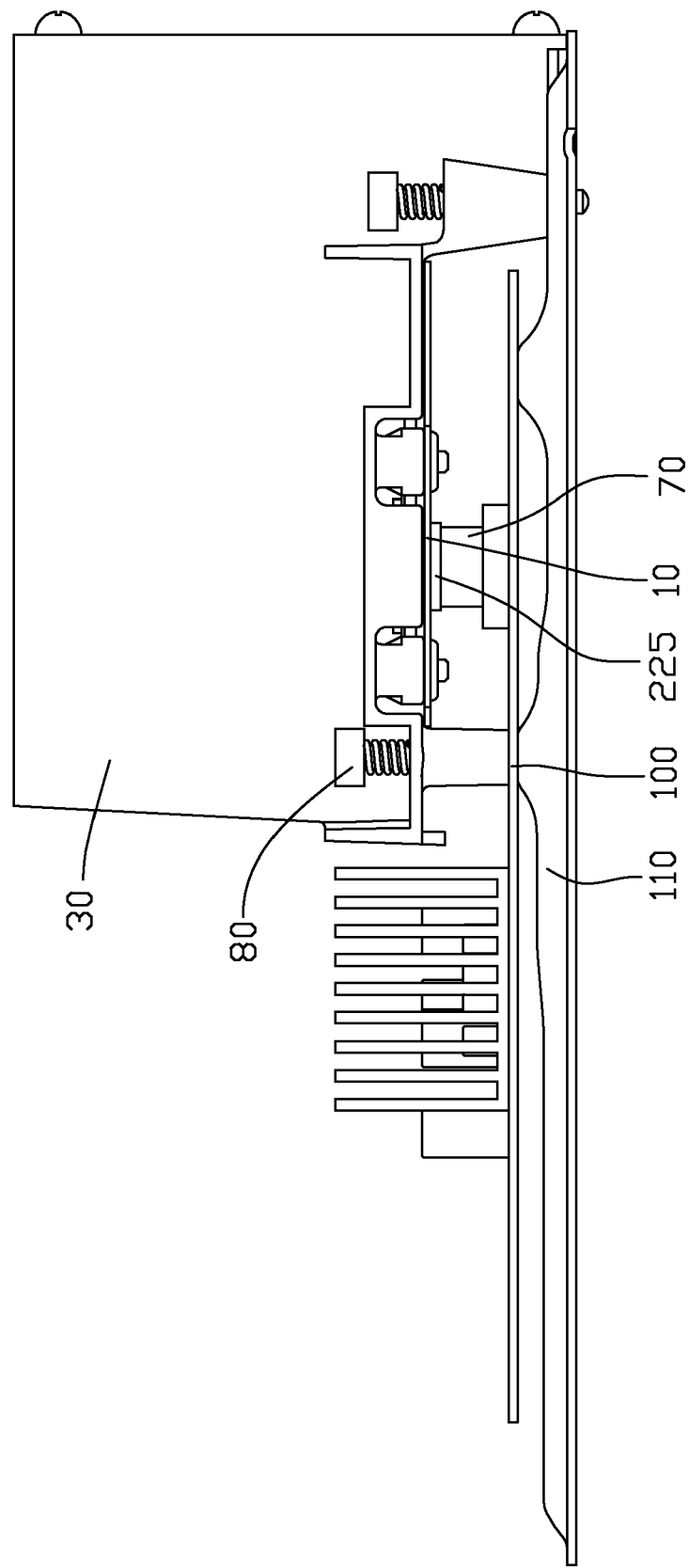

HEAT EXCHANGE MODULE

FIELD OF THE INVENTION

The present invention relates generally to an apparatus for dissipation of heat from heat-generating components, and more particularly to a heat exchange module suitable for removing heat from heat-generating electronic components.

DESCRIPTION OF RELATED ART

As progress continues developing in electronic industries, electronic components such as integrated circuit chips of computers are made to have more powerful functions while maintaining an unchanged size or even a smaller size. As a result, the amount of heat generated by these electronic components during their normal operations is commensurately increased, which in turn will adversely affect their workability and stability. It is well known that heat dissipating devices are commonly used to remove heat from heat-generating components. However, currently well-known heat dissipating devices such as heat sinks plus electric fans are no longer qualified or desirable for removing the heat from these electronic components due to their low heat removal capacity. Conventionally, increasing the rotation speed of the electric fan and increasing the size of the heat sink are two approaches commonly used to improve the heat dissipating performance of the heat dissipating device involved. However, if the rotation speed of the electric fan is increased, problems such as large noise will inevitably be raised. On the other hand, by increasing the size of the heat sink, it will make the heat dissipating device bulky, which contravenes the current trend towards miniaturization.

Currently, a loop-type heat exchange device with a more efficient heat dissipating effect has been proposed, which generally includes an evaporator and a condenser. The evaporator contains therein a working fluid. The working fluid in the evaporator evaporates into vapor after absorbing heat from a heat source, and the generated vapor is transferred to the condenser where the vapor is condensed into condensate after the vapor releases the heat. The condensate in the condenser is then transferred back to the evaporator for being available again for evaporation, thus forming a heat transfer loop for continuously taking heat away from the heat source.

When the foregoing heat exchange device is mounted to, for example, a computer system for dissipating heat from a heat generating electronic component thereof, the evaporator and the condenser often are required to be mounted individually. It is a time-consuming and tiresome job to do so. Sometimes, it is also desirable to detach the heat exchange device from the computer system for repair or replacement. In this situation, the evaporator and the condenser must also be individually addressed so as to remove the heat exchange device from the computer system.

Therefore, it is desirable to provide a highly efficient heat dissipating device which overcomes the foregoing disadvantages.

SUMMARY OF INVENTION

The present invention relates to a heat exchange module for removing heat from a heat-generating component. The heat exchange module includes a fan duct, an evaporator, a condenser and an electric fan. The fan duct includes a lower portion and an upper portion. The lower portion cooperates with the upper portion to define therebetween an air passage. The evaporator contains therein a working fluid. The condenser is in fluid communication with the evaporator. The evaporator and the condenser are received in the air passage defined by the fan duct. The working fluid turns into vapor in the evaporator upon receiving heat from the heat-generating component and the vapor turns into condensate upon releasing the heat to the condenser. The electric fan is attached to the fan duct. The electric fan produces an airflow flowing through the air passage for removing the heat away from the condenser.

Other advantages and novel features of the present invention will become more apparent from the following detailed description of preferred embodiment when taken in conjunction with the accompanying drawings, in which:

BRIEF DESCRIPTION OF DRAWINGS

FIG. 10 is a side elevational view of the assembly of FIG. 9.

DETAILED DESCRIPTION

Figure 1:
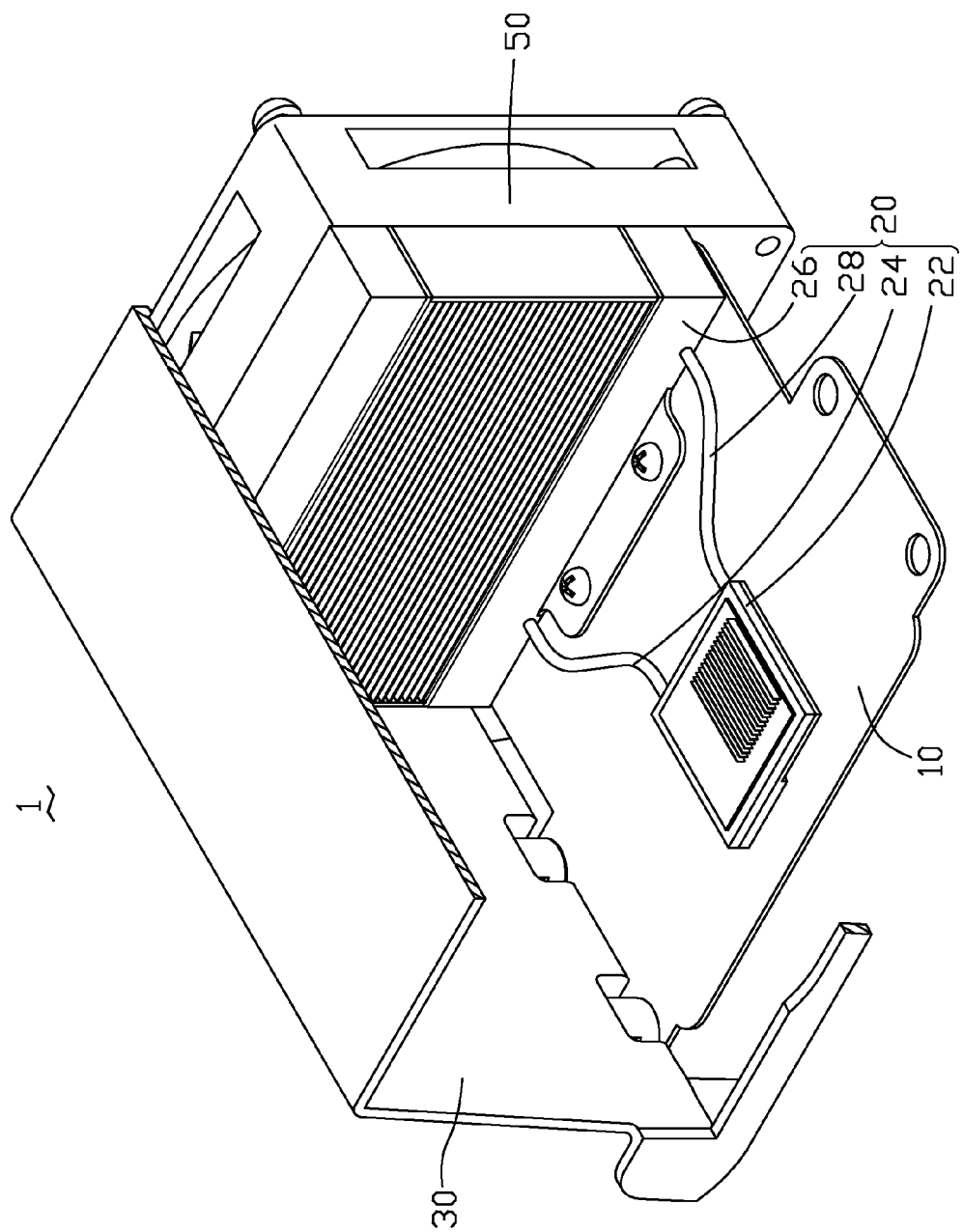
FIG. 1 is a partially sectioned, isometric view of a heat exchange module in accordance with one embodiment of the present invention.
Figure 2:
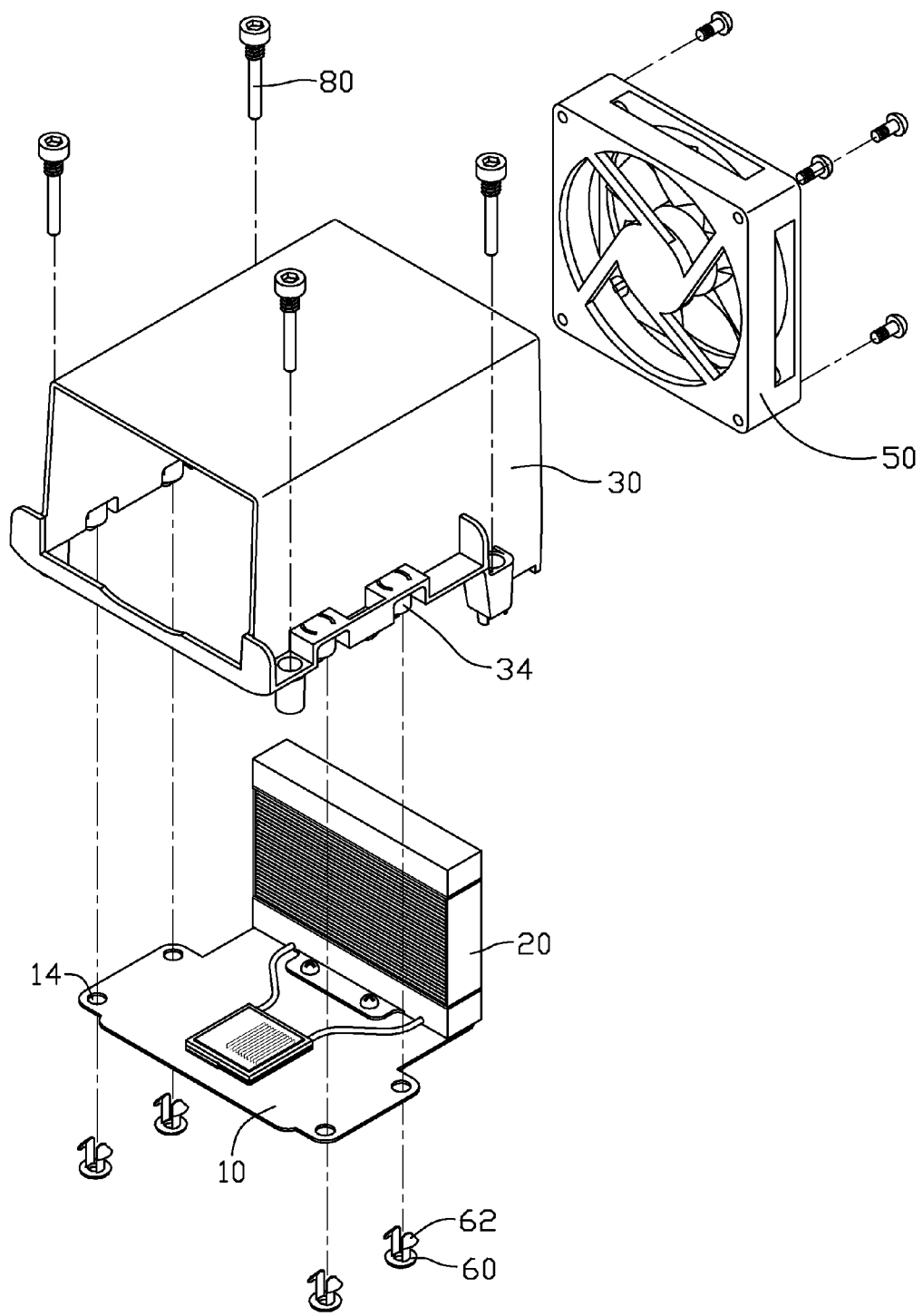
FIG. 2 is an exploded, isometric view of the heat exchange module of FIG. 1.

FIGS. 1-2 illustrate a heat exchange module 1 in accordance with one embodiment of the present invention. The heat exchange module 1 includes a mounting base 10, a loop-type heat exchange device 20, an air-guiding member 30 and an electric fan 50. The heat exchange device 20 is mounted on the mounting base 10 and located within the air-guiding member 30. The exchange device 20 includes an evaporator 22, a vapor conduit 24, a condenser 26 and a liquid conduit 28. Two ends of each of the vapor and liquid conduits 24, 28 are connected to the evaporator 22 and the condenser 26, respectively. The air-guiding member 30 is mounted to the mounting base 10 by a plurality of fasteners 60. The electric fan 50 is attached by a plurality of screws (not labeled) to one longitudinal side of the air-guiding member 30 to which the condenser 26 of the heat exchange device 20 is adjacent. The heat exchange module 1 as a whole is attached to a heat-generating component such a central processing unit (CPU) 70 of a computer system for dissipating heat from the CPU 70, as illustrated in FIG. 10. In this embodiment, the heat exchange module 1 is attached to the CPU 70 by a plurality of screws 80, as shown in FIGS. 2 and 10.

Figure 3:
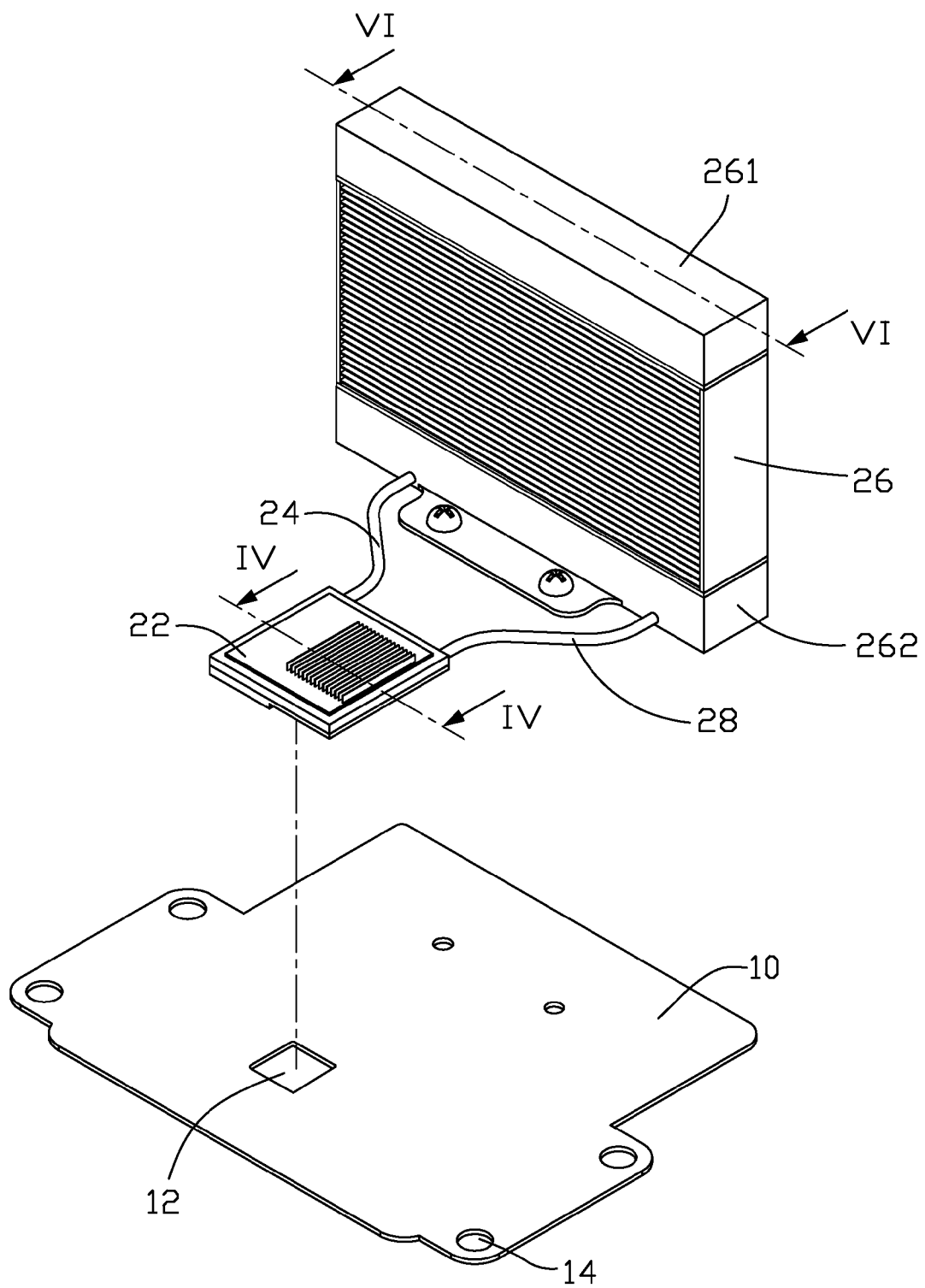
FIG. 3 is an exploded, isometric view of a loop-type heat exchange device and a mounting base of the heat exchange module of FIG. 1.

As shown in FIG. 3, the mounting base 10 has a substantially rectangular, plate-like configuration. The mounting base 10 defines a through hole 12 therein and four mounting holes 14 around the through hole 12 of the mounting base 10.

Figure 4:
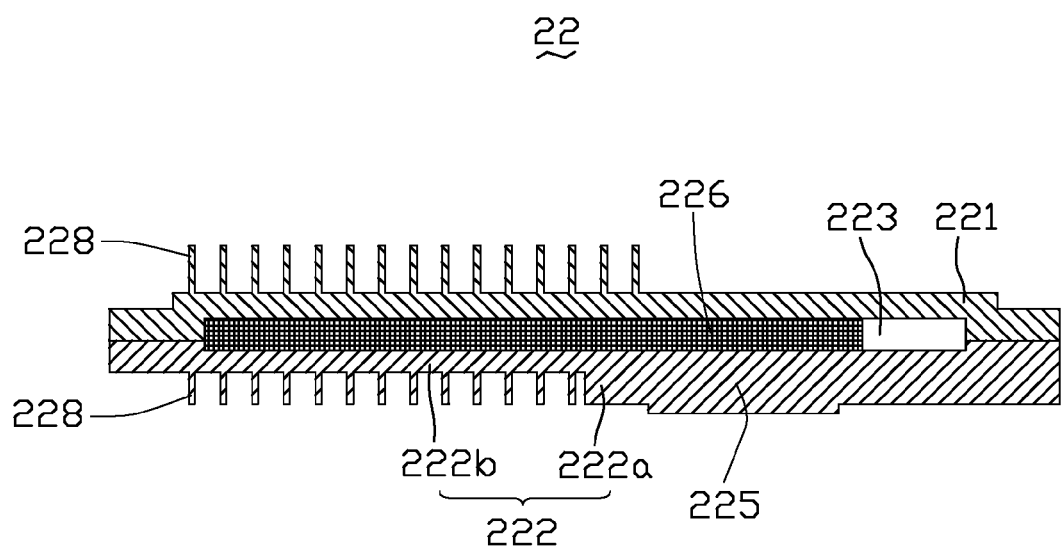
FIG. 4 is a cross-sectional view of an evaporator of the loop-type heat exchange device of FIG. 3, taken along line IV-IV thereof.
Figure 5:
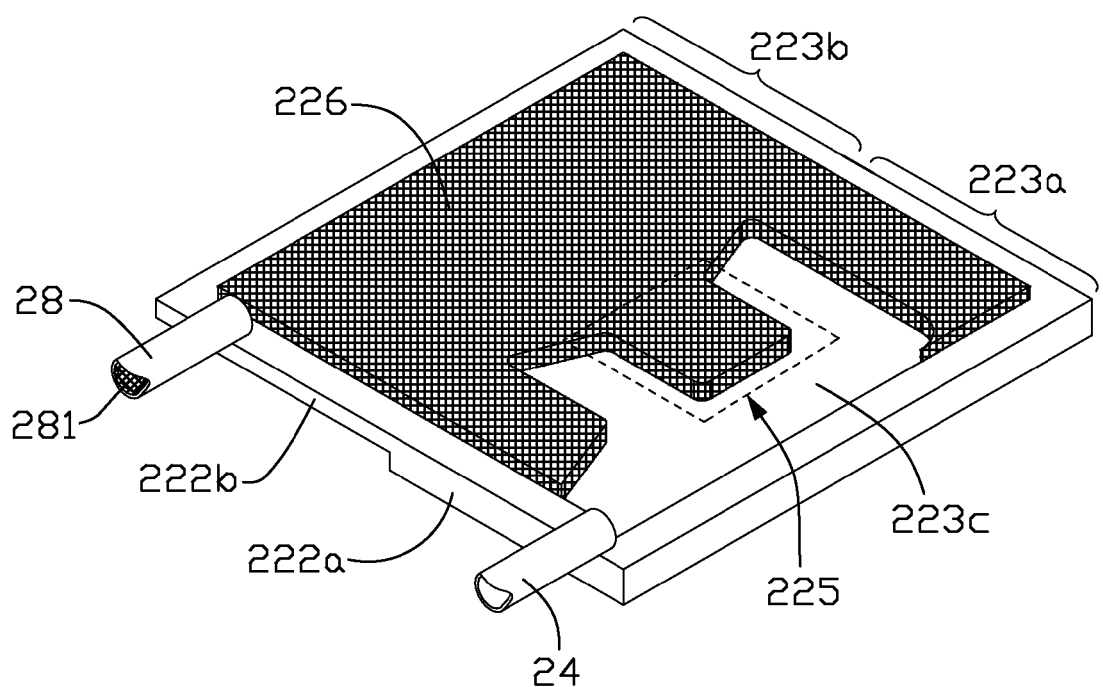
FIG. 5 is an isometric view of the evaporator of FIG. 3, with a top cover thereof being removed.

With reference to FIGS. 4-5, the evaporator 22 has a plate-type configuration including a top cover 221 and a bottom cover 222. The top and bottom covers 221, 222 cooperate with each other to define a chamber 223 inside the evaporator 22. The bottom cover 222 includes a first, thicker section 222a and a second, thinner section 222b integrally extending from one side of the first section 222a. The first section 222a projects downwardly to an extent below the second section 222b with a step (not labeled) formed between the first and second sections 222a, 222b. A protrusion 225 is formed by extending further downwardly from a substantially middle portion of the first section 222a of the bottom cover 222 for passing through the through hole 12 of the mounting base 10 to contact with the CPU 70. A first wick structure 226 is arranged inside the evaporator 22 and saturated with a working fluid (not shown) such as water or alcohol. The first wick structure 226 is preferably in the form of sintered powders or a screen mesh made of flexible metal wires or organic fibers woven together.

The chamber 223 of the evaporator 22 includes two major regions, i.e., an evaporating region 223a and an adjacent liquid micro-channel region 223b, corresponding to the first and second sections 222a, 222b of the bottom cover 222 of the evaporator 22, respectively. The micro-channel region 223b is fully filled with the first wick structure 226. Also, a portion of the first wick structure 226 extends from the micro-channel region 223b into a middle part of the evaporating region 223a. This portion of the first wick structure 226 has a size substantially equal to that of the protrusion 225 of the bottom cover 222, and is fittingly located just above and covers the protrusion 225. Additionally, another portion of the first wick structure 226 also extends from the micro-channel region 223b into front and rear sides of the evaporating region 223a, as viewed from FIG. 5. As a result, the first wick structure 226 spans across both the micro-channel region 223b and the evaporating region 223a. The remaining part of the evaporating region 223a not filled with the first wick structure 226 is provided as a vapor-gathering sub-region 223c for accommodating the generated vapor in the evaporator 22. The vapor and liquid conduits 24, 28 are connected to the evaporating region 223a and the micro-channel region 223b, respectively. Specifically, the vapor conduit 24 communicates with the vapor-gathering sub-region 223c so as to enable the vapor gathered in the vapor-gathering sub-region 223c to leave the evaporator 22 into the vapor conduit 24. As particularly shown in FIG. 4, a plurality of metal fins 228 extends from an outer surface of each of the top and bottom covers 221, 222, aligned with the micro-channel region 223b.

In order to bring the condensate from the condenser 26 back to the evaporator 22 timely, a second wick structure 281 is provided inside the liquid conduit 28, as particularly shown in FIG. 5. The second wick structure 281 may be fine grooves integrally formed at the inner surface of the liquid conduit 28, screen mesh or bundles of fiber inserted into the liquid conduit 28, or sintered powders combined to the inner surface of the liquid conduit 28.

Figure 6:
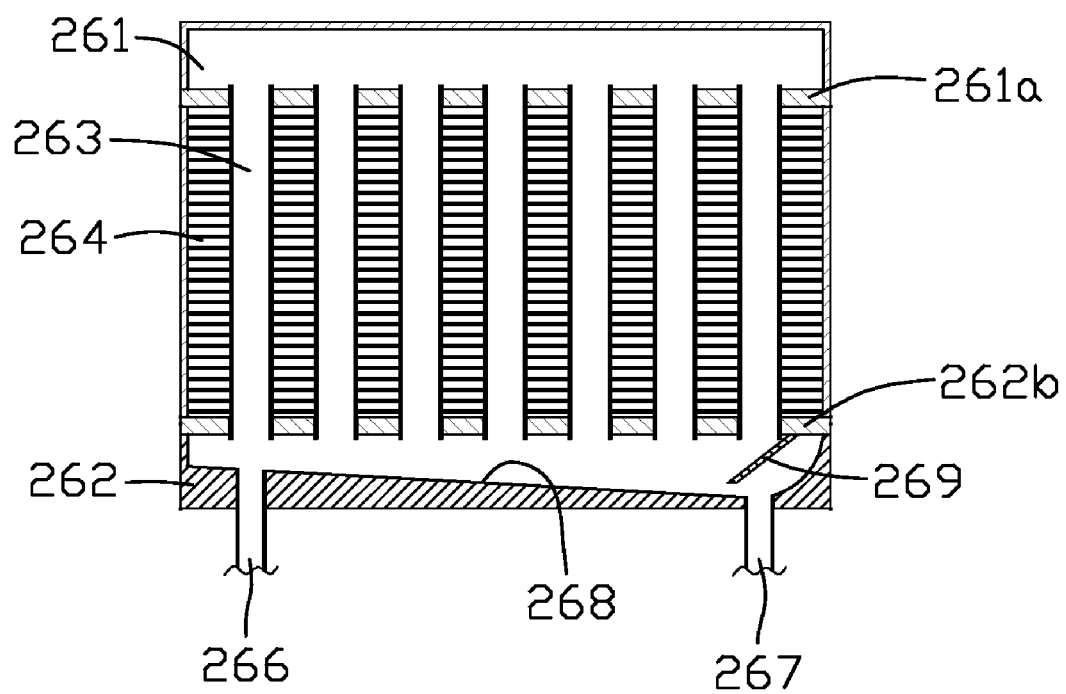
FIG. 6 is a cross-sectional view of a condenser of the loop-type heat exchange device of FIG. 3, taken along line VI-VI thereof.

Referring now to FIG. 6, the condenser 26 includes top and bottom housings 261, 262 and a plurality of condensing tubes 263 along which a plurality of metal fins 264 is stacked. Each of the top and bottom housings 261, 262 has an elongated, box-like structure. These condensing tubes 263 are located between the top and bottom housings 261, 262 and are positioned in parallel with each other. Two ends of each of these condensing tubes 263 are communicated with the top and bottom housings 261, 262, respectively. Specifically, a bottom wall 261a of the top housing 261 and a top wall 262a of the bottom housing 262 each define therein a plurality of holes (not labeled). Top and bottom ends of these condensing tubes 263 are fixedly and hermetically positioned in these holes defined in the walls 261a, 262a. As presenting a large heat dissipating surface area, the metal fins 264 are made of highly thermally conductive material such as copper or aluminum and are maintained in intimate thermal contact with a circumferential surface of each of the condensing tubes 263. The bottom housing 262 has an inlet 266 and an outlet 267 for being connected to the vapor and liquid conduits 24, 28, respectively. As shown in FIGS. 1-3, the condenser 26 is positioned in an upright position with the condensing tubes 263 being located perpendicularly to the liquid conduit 28.

As heat from the CPU 70 is applied to the evaporator 22, the working fluid contained in the evaporator 22 evaporates into vapor after absorbing the heat. Then, the generated vapor flows, via the vapor conduit 24, to the condenser 26 where the vapor releases its latent heat of evaporation and accordingly turns into condensate. The vapor conduit 24 may also have a larger diameter than the liquid conduit 28 so as to enable the generated vapor in the evaporator 22 to move towards the condenser 26 smoothly. Specifically, the heat generated by the CPU 70 is firstly transferred to the first section 222a of the bottom cover 222 and then to the evaporating region 223a of the chamber 223 to cause the working fluid contained in that region to evaporate into the vapor. Due to the difference of vapor pressure between the evaporator 22 and the condenser 26, the generated vapor moves towards the condenser 26. As the vapor enters into the bottom housing 262 of the condenser 26 through the inlet 266, the vapor moves freely into the condensing tubes 263 where the vapor releases the heat carried thereby to the metal fins 264 contacting the condensing tubes 263. The heat further is dissipated into ambient environment by the condenser 26 in combination with the electric fan 50. With these condensing tubes 263 and metal fins 264, the condenser 26 has a large heat removal capacity and therefore the vapor can be effectively cooled at the condenser 26.

In order to prevent the vapor transferred by the vapor conduit 24 from being prematurely condensed in the vapor conduit 24 due to the cooling of the airflow of the electric fan 50, the vapor conduit 30 is preferably made of heat insulating material. Due to gravity, the condensate resulted from the vapor in the condensing tubes 263 flows towards the bottom housing 262. Thereafter, the condensate gathered in the bottom housing 262 flows through the outlet 267 into the liquid conduit 28 through which the condensate is brought back to the evaporator 22 where it is again available for evaporation. In order to enable the condensate contained in the bottom housing 262 to enter into the liquid conduit 28 more rapidly and smoothly, the bottom housing 262 has a slanted inner bottom surface 268 declining from the inlet 266 towards the outlet 267. The bottom surface 268 has a lowest level around the outlet 267. On the other hand, in order to prevent the vapor in the bottom housing 262 from directly entering into the liquid conduit 28 through the outlet 267 without having been condensed in the condenser 26, a baffle 269 is provided above the outlet 267 and arranged in such a manner that it blocks a vast majority of the vapor in the bottom housing 262 to directly enter into the liquid conduit 28 but does not block the condensate in the bottom housing 262 to enter into the liquid conduit 28. After the working fluid in the evaporating region 223a is evaporated, an inventory of the working fluid in the evaporating region 223a is reduced due to the evaporation in that region. The condensate returned to the micro-channel region 223b is subsequently supplied to the evaporating region 223a for being available again for evaporation as a result of the capillary force of the first wick structure 226. This cycle of the working fluid effectively takes heat away from the CPU 70.

In the heat exchange device 20, the movement of the working fluid forms a heat transfer loop whereby the heat of the CPU 70 is effectively removed away. The movements of the vapor and the condensate in the heat exchange device 20 are carried out separately in the respective vapor and liquid conduits 24, 28. The condensate is drawn back to the evaporator 22 under the capillary forces of the second and first wick structures 281, 226 as respectively provided in the liquid conduit 28 and the evaporator 22, thereby preventing an excessive amount of the condensate from accumulating in the condenser 26 and meanwhile avoiding the potential dry-out problem occurring at the evaporator 22.

Figure 7:
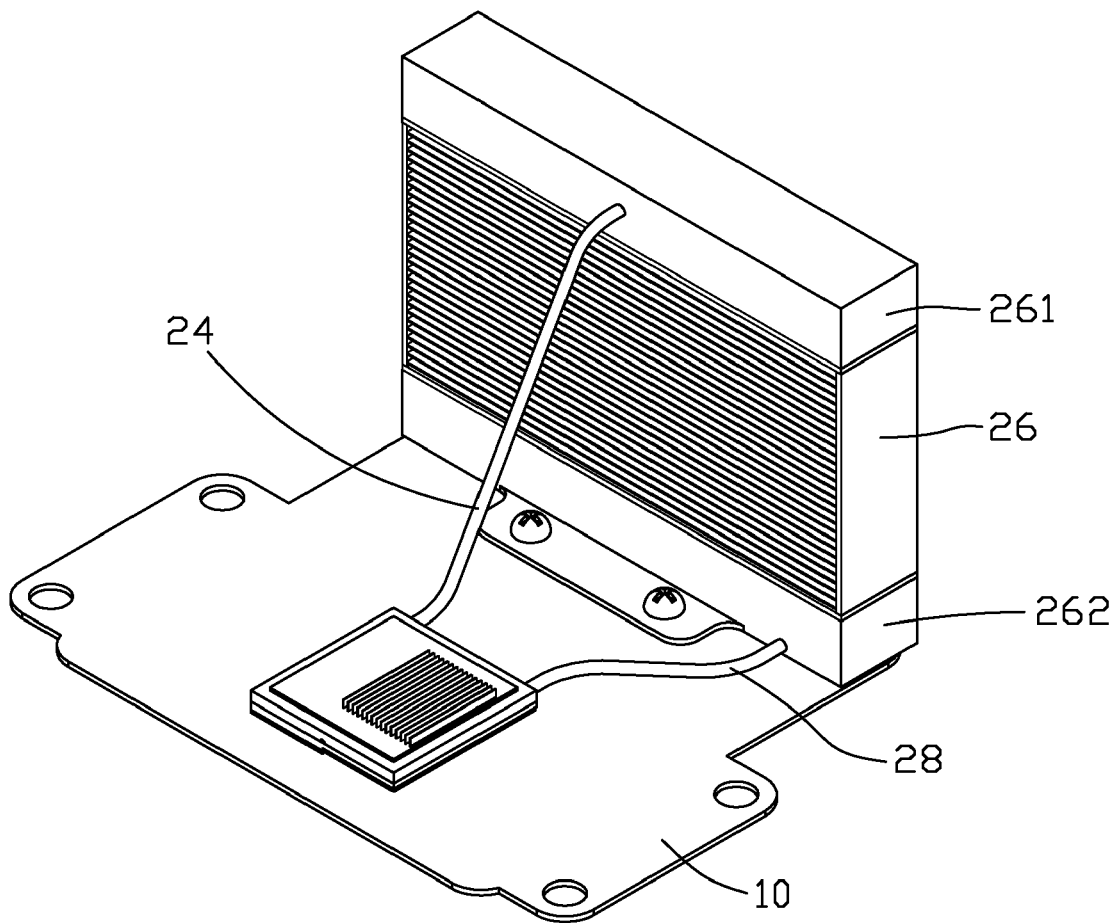
FIG. 7 is similar to FIG. 3, showing a loop-type heat exchange device in accordance with another example, the heat exchange device being mounted on the mounting base.

FIG. 7 shows an alternative embodiment of the present heat exchange device 10. In this embodiment, the vapor and liquid conduits 24, 28 are connected to the top and bottom housings 261, 262 of the condenser 26, respectively. Since the vapor transferred by the vapor conduit 24 enters into the condenser 26 from the top housing 261, the baffle 269 as provided in the bottom housing 262 as shown in FIG. 6 is no longer required.

In the present heat exchange device 20, the two-section design of the bottom cover 222 with different thicknesses is aimed to reduce an amount of the heat of the CPU to be conducted from the first section 222a to the second section 222b and finally to the micro-channel region 223b of the evaporator 22. Since the first section 222a has a larger thickness than the second section 222b, the heat conducted laterally from the first section 222a towards the second section 222b is reduced in comparison with a bottom cover with a uniform thickness. Accordingly, the heat transferred to the micro-channel region 223b of the evaporator 22 from the bottom cover 222 is also effectively reduced, the condensate in the micro-channel region 223b is less likely to be heated directly in that region, and excessive vapor is thus prevented from being formed and accumulated in the micro-channel region 223b.

The metal fins 228 of the evaporator 22 are provided as a cooling device to lower down the temperature of the micro-channel region 223b and at the same time to prevent vapor from being formed and accumulated in that region. Since the micro-channel region 223b is connected with the adjacent evaporating region 223a, a portion of the vapor generated in the evaporating region 223a will "creep" from the evaporating region 223a into the micro-channel region 223b due to a large vapor pressure in the vapor-gathering sub-region 223c. Additionally, the temperature in the micro-channel region 223b will also gradually increase, subject to a relatively high temperature and a flow of the vapor in the evaporating region 223a. The metal fins 228 are applied to directly condense the vapor entering into the micro-channel region 223b and meanwhile to dissipate the heat transferred to the micro-channel region 223b from the adjacent evaporating region 223a or the second, thinner section 222b of the bottom cover 222. Thus, due to the presence of the metal fins 228, the vapor potentially to be formed and accumulated in the micro-channel region 223b is greatly reduced.

Figure 8:
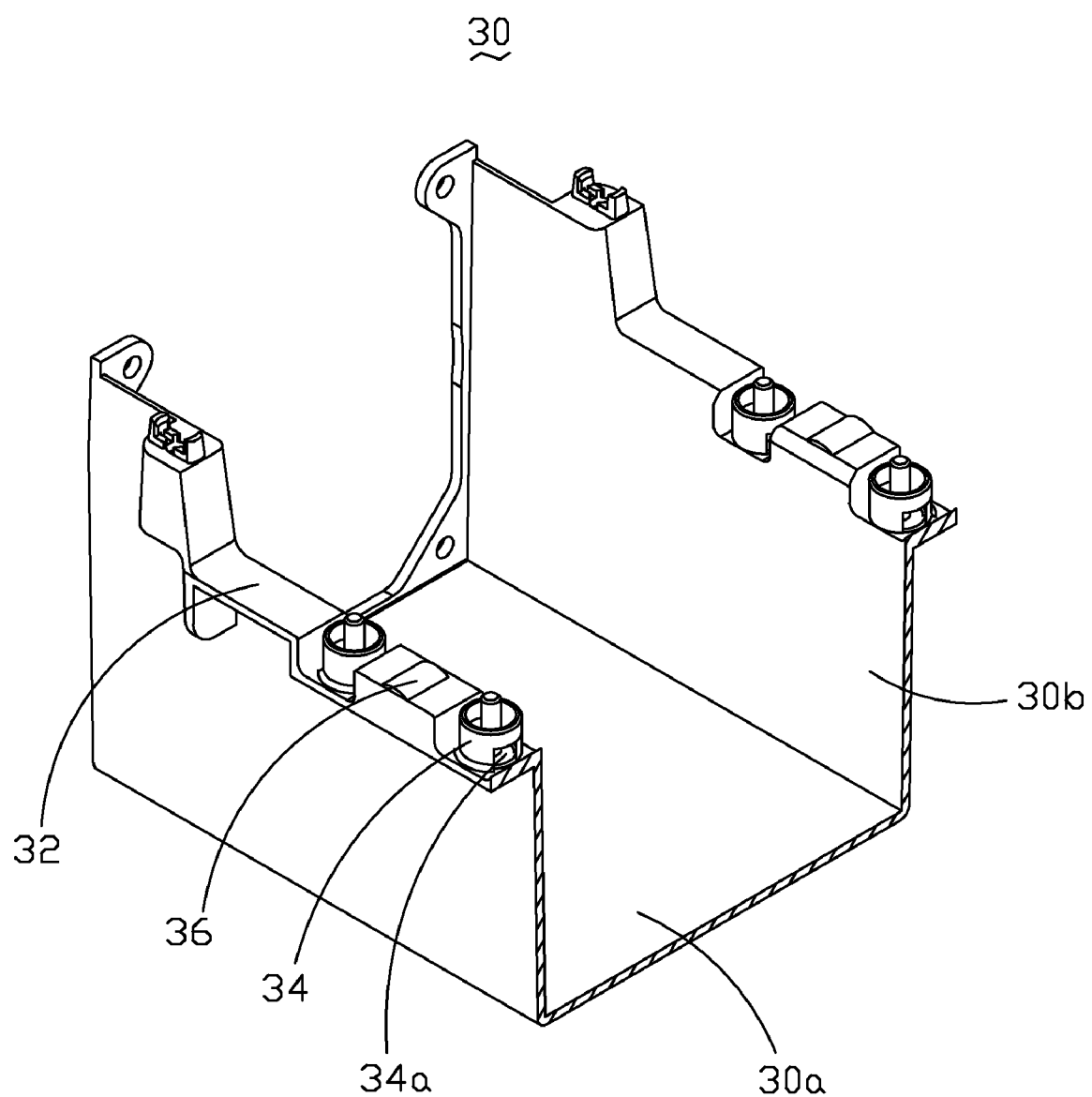
FIG. 8 is a partially sectioned, isometric view of a fan duct of the heat exchange module of FIG. 1 in an upside down manner.

The air-guiding member 30, as shown in more detail in FIG. 8, has an inverted U-shaped configuration and includes a top plate 30a and a pair of sidewalls 30b depending from opposite sides of the top plate 30a. A flange 32 extends outwardly from a bottom edge of each of the sidewalls 30b. A pair of mounting sleeves 34, as being spaced from each other, is formed on the flange 32. Each of the flanges 32 has a arced projection 36 formed thereon. The arced projection 36 projects downwardly and is located between the mounting sleeves 34 formed on each flange 32. Each of the mounting sleeves 34 of the air-guiding member 30 defines a pair of opposite cutouts 34a. With reference also to FIG. 2, the mounting sleeves 34 are aligned with the mounting holes 14 of the mounting base 10. Each of the fasteners 60 has a pair of elastic barbs 62 extending outwardly and downwardly from opposite sides of a tip end thereof, corresponding to the cutouts 34a of each of the mounting sleeves 34.

Figure 9:
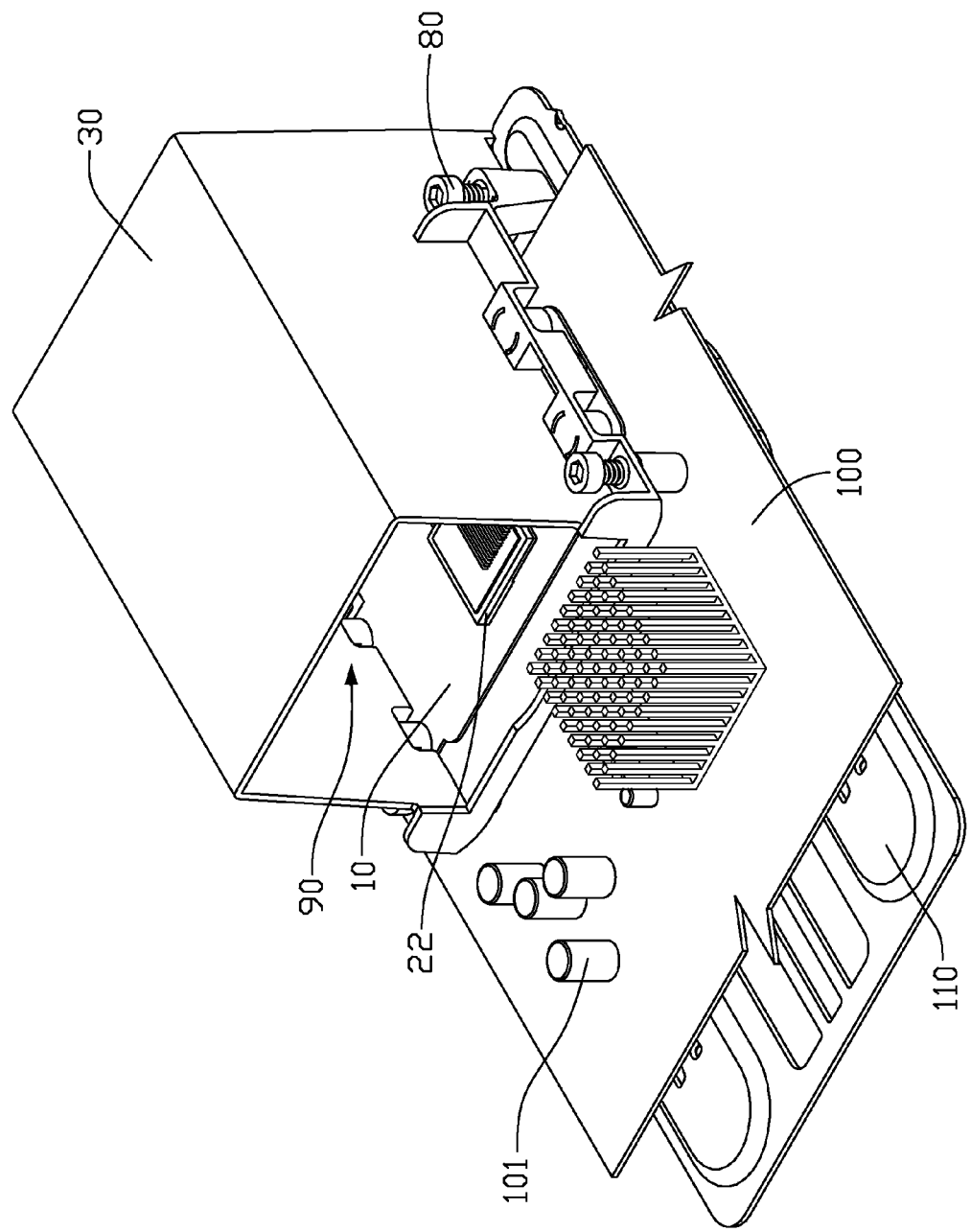
FIG. 9 is an isometric view showing the heat exchange module of FIG. 1 being assembled to a computer system.

With reference to FIGS. 1-3 and 9-10, in assembly, the evaporator 22 of the heat exchange device 20 is mounted to the mounting base 10. The protrusion 225 of the evaporator 22 is received in the through hole 12 of the mounting base 10 and projects below an underside of the mounting base 10 in order for contacting with the CPU 70. The fasteners 60 respectively extend through the mounting holes 14 of the mounting base 10 and extend into the mounting sleeves 34 of the air-guiding member 30. The barbs 62 of the fasteners 60 are brought into engagement with the mounting sleeves 34 in the cutouts 64a whereby the air-guiding member 30 is mounted to the mounting base 10. At this position, the arced protrusions 36 of the air-guiding member 30 are also brought into abutment with the mounting base 10. Due to the presence of the protrusions 36, the mounting base 10 is capable of being rotated with respect to the air-guiding member 30 around the two protrusions 36 within a small angle of rotation so as to perfectly maintain the protrusion 225 of the evaporator 22 to have a coplanar contact with the entire top surface of the CPU 70 as the heat exchange module 1 is mounted to the CPU 70 for dissipating heat therefrom. The electric fan 50 is attached to the air-guiding member 30 and located adjacent to the condenser 26. The electric fan 50 has a footprint larger than that of the condenser 26 and a bottom portion of the electric fan 50 extends below the mounting base 10, as particularly shown in FIG. 1. The air-guiding member 30 cooperates with the mounting base 10 to form a fan duct with an air passage 90 being formed in the fan duct for passage of the airflow of the electric fan 50, as shown in FIG. 9. The heat exchange device 20 is received in the air passage 90 of the air duct. The airflow of the electric fan 50 is guidable from one end of the air passage where the condenser 26 is located to the other end thereof.

After being previously assembled, the heat exchange module 1 can be subsequently mounted to the CPU 70 of the computer system easily by the screws 80 extending respectively through holes (not labeled) defined in the flanges 32 of the air-guiding member 30 and finally secured to a printed circuit board (PCB) 100 on which the CPU 70 is mounted or a system casing 110 of the computer system, which is mounted under the PCB 100. The protrusion 225 of the evaporator 22 is maintained in thermal contact with the CPU 70. The mounting base 10 is spaced from the PCB 100 by a specific distance, which is substantially the same as a length of that portion of the electric fan 50 that extends below the mounting base 10, as shown in FIG. 10. The airflow produced by the electric fan 50 is capable of being divided into two currents, one current flowing through the air passage 90 for cooling the condenser 26 of the heat exchange device 20, the other current flowing from beneath the mounting base 10 for simultaneously cooling the CPU 70, the evaporator 22 of the heat exchange device 20 and the mounting base 10. Under the guidance of the fan duct, the airflow of the electric fan 50, after flowing through the air passage 90, is still capable of being used to cool other heat-generating electronic components 101 located near the heat exchange module 1 and which are also mounted on the PCB 100. In the present heat exchange module 1, the mounting base 10 is made of high thermally conductive material such as copper or aluminum in order to facilitate heat dissipation from the CPU 70. However, the mounting base 10 may also be made of plastic material in order to lower down the manufacturing cost thereof.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat exchange module for removing heat from a heat-generating component comprising:
    a fan duct including a lower portion and an upper portion, the lower portion cooperating with the upper portion to define therebetween an air passage;
    an evaporator containing therein a working fluid and having a lower protrusion fitting through the lower portion of the fan duct and adapted for thermally contacting the heat-generating component;
    a condenser being in fluid communication with the evaporator, wherein the evaporator and the condenser are received in said air passage, the working fluid turns into vapor in the evaporator upon receiving heat from said heat-generating component and the vapor turns into condensate upon releasing the heat to the condenser; and
    an electric fan attached to the fan duct, the electric fan producing an airflow flowing through the air passage for removing the heat away from the condenser;
    wherein the condenser includes a housing member, a plurality of tube members in fluid communication with the housing member, and a fin member maintained in thermal contact with the tube members.

2. The heat exchange module of claim 1, wherein said lower portion of the fan duct has a plate-like configuration and the upper portion of the fan duct has an inverted U-shaped configuration.

3. The heat exchange module of claim 2, wherein the upper portion of the fan duct includes a top plate and a pair of sidewalls depending from opposite sides of the top plate and the lower portion of the fan duct is mounted to the sidewalls of the upper portion by a plurality of fasteners.

4. The heat exchange module of claim 1, further comprising a vapor conduit and a liquid conduit each being connected between the evaporator and the condenser, the vapor conduit conveying the vapor generated in the evaporator to the tube members of the condenser, the vapor turning into condensate in the tube members upon releasing the heat to the fin member, the condensate being conveyed back to the evaporator by the liquid conduit.

5. The heat exchange module of claim 4, wherein the vapor conduit and liquid conduit both are connected to the housing member of the condenser and the housing member is provided with a baffle located adjacent to the liquid conduit and configured for stopping the vapor transferred to the first housing member by the vapor conduit from entering into the liquid conduit.

6. The heat exchange module of claim 4, wherein said housing member is a first housing member and the condenser further includes a second housing member being in fluid communication with said tube members, the tube members and the fin member being located between the first and second housing members, the liquid conduit being connected to the first housing member, the vapor conduit being connected to the second housing member.

7. The heat exchange module of claim 4, wherein a wick structure is arranged inside the liquid conduit.

8. The heat exchange module of claim 1, wherein the housing member has a slanted inner surface declining from the vapor conduit towards the liquid conduit.

9. The heat exchange module of claim 1, wherein the evaporator defines therein a chamber, the chamber having a first region adapted for receiving heat from said heat-generating component and a second region equipped with a wick structure, the vapor conduit and the liquid conduit communicating with the first and second regions, respectively.

10. The heat exchange module of claim 9, wherein the evaporator has a plurality of metal fins extending from an outer surface thereof, the metal fins being located in alignment with said second region.

11. The heat exchange module of claim 9, wherein the evaporator has an outer wall adapted for contacting said heat-generating component, the outer wall having first section and second section corresponding to the first and second regions of the chamber, respectively, the first section being thicker than the second section, the protrusion being extended downwardly from the first section.

12. A heat exchange module comprising:
    a base plate;
    an evaporator mounted on the base plate adapted for contacting a heat-generating electronic component;
    working fluid contained in the evaporator, the working fluid turning into vapor upon receiving heat from the electronic component;
    a vapor conduit having a first end connecting with the evaporator and a second end;
    a condenser mounted on the base plate, the second end of the vapor conduct connecting with the condenser, the vapor turning into liquid in the condenser;
    a liquid conduit having a first end connecting with the condenser and a second end connecting the evaporator, the liquid flowing to the evaporator via the liquid conduit, wherein the condenser has a slanted surface declining from the second end of the vapor conduit towards the first end of the liquid conduit, the liquid in the condenser being guided by the slanted surface to flow to the first end of the liquid conduit;
    an air guiding member mounted on the base plate and accommodating the evaporator and condenser therein; and
    a fan mounted to the air guiding member and located adjacent to the condenser.

13. The heat exchange module of claim 12, wherein the evaporator has a lower protrusion fitting through the base plate and adapted for thermally contacting with the heat-generating electronic component.

14. The heat exchange module of claim 13, wherein the second end of the vapor conduit and the first end of the liquid conduit are located at the same level.

15. The heat exchange module of claim 13, wherein the second end of the vapor conduit is located at a level higher than that of the first end of the liquid conduit.

16. The heat exchange module of claim 12, wherein an airflow generated by the fan flows through an air passage defined between the air guiding member and the base plate and a space below the base plate.

17. A heat exchange module for removing heat from a heat-generating component comprising:
- a fan duct including a lower portion and an upper portion, the lower portion cooperating with the upper portion to define therebetween an air passage;
- an evaporator containing therein a working fluid and having a lower protrusion fitting through the lower portion of the fan duct and adapted for thermally contacting the heat-generating component;
- a condenser being in fluid communication with the evaporator, wherein the evaporator and the condenser are received in said air passage, the working fluid turns into vapor in the evaporator upon receiving heat from said heat-generating component and the vapor turns into condensate upon releasing the heat to the condenser; and
- an electric fan attached to the fan duct, the electric fan producing an airflow flowing through the air passage for removing the heat away from the condenser;
- wherein the evaporator defines therein a chamber, the chamber having a first region adapted for receiving heat from said heat-generating component and a second region equipped with a wick structure, the vapor conduit and the liquid conduit communicating with the first and second regions, respectively.

18. The heat exchange module of claim 17, wherein the evaporator has a plurality of metal fins extending from an outer surface thereof, the metal fins being located in alignment with said second region.

19. The heat exchange module of claim 18, wherein the evaporator has an outer wall adapted for contacting said heat-generating component, the outer wall having first section and second section corresponding to the first and second regions of the chamber, respectively, the first section being thicker than the second section, the protrusion being extended downwardly from the first section.

* * * * *